(12) United States Patent
Tan et al.

(10) Patent No.: US 11,716,829 B1
(45) Date of Patent: Aug. 1, 2023

(54) INTEGRATED FAN AND HEAT SINK FOR HEAD-MOUNTABLE DEVICE

(71) Applicant: Apple Inc., Cupertino, CA (US)

(72) Inventors: Cheng P. Tan, Fremont, CA (US); Sivesh Selvakumar, Sunnyvale, CA (US); Jesse T. Dybenko, Santa Cruz, CA (US); Enoch Mylabathula, Cupertino, CA (US); Jason C. Sauers, Sunnyvale, CA (US); Phil M. Hobson, Menlo Park, CA (US); Laura M. Campo, Santa Clara, CA (US); Dragos Moroianu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/165,763

(22) Filed: Feb. 2, 2021

Related U.S. Application Data

(60) Provisional application No. 62/990,978, filed on Mar. 17, 2020.

(51) Int. Cl.
*H05K 7/20* (2006.01)

(52) U.S. Cl.
CPC ....... *H05K 7/20136* (2013.01); *H05K 7/2039* (2013.01)

(58) Field of Classification Search
CPC .......... H05K 7/20409; H05K 7/20418; H05K 7/20427; H05K 7/20436; H05K 9/0007; H05K 7/20136; H05K 7/20145; H05K 7/20154; H05K 7/20172; H05K 7/2039; H05K 7/20009; H01L 23/467; H01L 23/46; H01L 23/34; H01L 23/367; H01L 23/3677; H01L 23/3675; H01L 23/3672
See application file for complete search history.

(56) References Cited

U.S. PATENT DOCUMENTS

| | | | | |
|---|---|---|---|---|
| 5,940,268 A * | 8/1999 | Miyahara | ............. | H01L 23/467 165/185 |
| 6,125,924 A * | 10/2000 | Lin | ............. | G06F 1/20 165/122 |
| 6,170,563 B1 * | 1/2001 | Hsieh | ............. | H01L 23/467 165/122 |
| 6,725,906 B2 * | 4/2004 | Lin | ............. | G06F 1/20 257/722 |
| 6,765,326 B1 * | 7/2004 | Nakazono | ............. | F16C 33/107 310/90 |
| 7,333,332 B2 * | 2/2008 | Wang | ............. | H01L 23/467 174/16.3 |

(Continued)

*Primary Examiner* — Adam B Dravininkas
(74) *Attorney, Agent, or Firm* — BakerHostetler

(57) ABSTRACT

A head-mountable device can provide a cooling module that effectively manages heat while also minimizing noise, vibration, leakage, power consumption, size, and weight. To dissipate heat, the cooling module with a fan can be operated to move air through a chamber within the head-mountable device. An integrated heat sink can provide heat dissipation properties by drawing heat away from heat-generating components and into the chamber. The integrated heat sink can include a base plate that defines at least a portion of the chamber in which the blades of the fan are positioned. The integrated heat sink can further include fins between the chamber and an outlet. The fins can be integrated with the base plate to maximize heat dissipation and reduce the number of interfaces between separate parts.

19 Claims, 4 Drawing Sheets

(56) References Cited

U.S. PATENT DOCUMENTS

| | | | | |
|---|---|---|---|---|
| 7,542,292 B2* | 6/2009 | Stefanoski | ......... | H05K 7/20772 |
| | | | | 361/689 |
| 9,756,761 B2* | 9/2017 | Inoue | ................ | H05K 7/20154 |
| 10,034,411 B2 | 7/2018 | Prather et al. | | |
| 10,718,342 B2* | 7/2020 | Chang | ................ | F04D 29/4226 |
| 2002/0080579 A1* | 6/2002 | Shibasaki | ............. | H01L 23/467 |
| | | | | 257/E23.099 |
| 2003/0128513 A1* | 7/2003 | Wiley | ................ | H05K 7/20727 |
| | | | | 257/E23.099 |
| 2003/0196779 A1* | 10/2003 | Horng | ................ | H01L 23/467 |
| | | | | 165/122 |
| 2004/0244947 A1* | 12/2004 | Chen | ....................... | F28F 13/06 |
| | | | | 257/E23.099 |
| 2009/0225534 A1* | 9/2009 | Thomas | ................. | F21V 29/80 |
| | | | | 362/373 |
| 2011/0192572 A1* | 8/2011 | Tsai | ..................... | H01L 23/473 |
| | | | | 165/104.19 |
| 2011/0247789 A1* | 10/2011 | Yu | ......................... | F04D 29/441 |
| | | | | 415/206 |
| 2014/0090819 A1* | 4/2014 | Lin | ...................... | H01L 23/373 |
| | | | | 165/121 |
| 2017/0094835 A1* | 3/2017 | Prather | ................ | H01L 23/427 |
| 2017/0184863 A1 | 6/2017 | Balachandreswaran et al. | | |
| 2019/0021184 A1 | 1/2019 | Williams et al. | | |

* cited by examiner

INTEGRATED FAN AND HEAT SINK FOR HEAD-MOUNTABLE DEVICE

CROSS-REFERENCE TO RELATED APPLICATION

This application claims the benefit of U.S. Provisional Application No. 62/990,978, entitled "INTEGRATED FAN AND HEAT SINK FOR HEAD-MOUNTABLE DEVICE," filed Mar. 17, 2020, the entirety of which is incorporated herein by reference.

TECHNICAL FIELD

The present description relates generally to head-mountable devices, and, more particularly, to fans and heat sinks for head-mountable devices.

BACKGROUND

A head-mountable device can be worn by a user to display visual information within the field of view of the user. The head-mountable device can be used as a virtual reality (VR) system, an augmented reality (AR) system, and/or a mixed reality (MR) system. A user may observe outputs provided by the head-mountable device, such as visual information provided on a display. The display can optionally allow a user to observe an environment outside of the head-mountable device. Other outputs provided by the head-mountable device can include speaker output and/or haptic feedback. A user may further interact with the head-mountable device by providing inputs for processing by one or more components of the head-mountable device. For example, the user can provide tactile inputs, voice commands, and other inputs while the device is mounted to the user's head.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
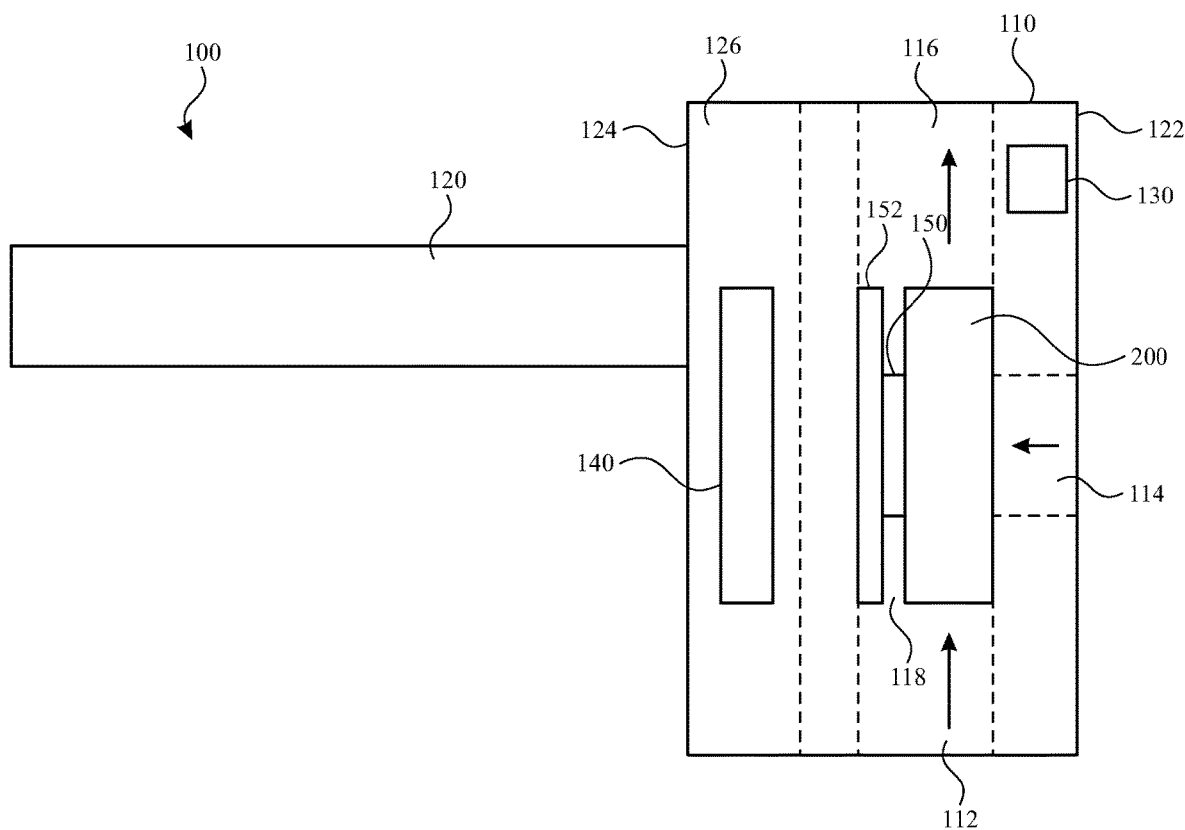
FIG. 1 illustrates a side view of a head-mountable device, according to some embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Head-mountable devices, such as head-mountable displays, headsets, visors, smartglasses, head-up display, etc., can perform a range of functions that are managed by the components (e.g., sensors, circuitry, and other hardware) included with the wearable device. The head-mountable device can provide a user experience that is immersive or otherwise natural so the user can easily focus on enjoying the experience without being distracted by the mechanisms of the head-mountable device.

Components of a head-mountable device can generate heat during operation. Excessive heat for long durations of time can damage the components of the head-mountable device and cause discomfort to the user. Heat can be mitigated in a number of ways, including with active mechanisms (e.g., fans) that are integrated into the head-mountable device.

However, operation of active cooling mechanisms (e.g., air movers) can generate noise and vibration that may interfere with the user's desired experience with the head-mountable device. In particular, head-mountable devices are mounted on the head of the user and in close proximity to the ears of the user while in use. Thus, it can be desirable to reduce any noise and vibration so that it is not perceived by the user. Additionally, it can be desirable to increase the efficiency of components of a head-mountable device to minimize power requirements during operation. Furthermore, it can be desirable to reduce the size and weight of components of a head-mountable device so that the size and weight of the overall system is minimized, thereby allowing the user to wear and operate the head-mountable device with greater comfort.

Systems of the present disclosure can provide a cooling module that effectively manages heat while also minimizing noise, vibration, leakage, power consumption, size, and weight. To dissipate heat, the cooling module with a fan can be operated to move air through a chamber within the head-mountable device. An integrated heat sink can provide heat dissipation properties by drawing heat away from heat-generating components and into the chamber. The integrated heat sink can include a base plate that defines at least a portion of the chamber in which the blades of the fan are positioned. The integrated heat sink can further include fins between the chamber and an outlet. The fins can be integrated with the base plate to maximize heat dissipation and reduce the number of interfaces between separate parts.

These and other embodiments are discussed below with reference to FIGS. 1-6. However, those skilled in the art will readily appreciate that the detailed description given herein with respect to these Figures is for explanatory purposes only and should not be construed as limiting.

According to some embodiments, for example as shown in FIG. 1, a head-mountable device 100 includes a frame 110 that is worn on a head of a user. The frame 110 can be positioned in front of the eyes of a user to provide information within a field of view of the user. The frame 110 can provide nose pads or another feature to rest on a user's nose. The frame 110 can be supported on a user's head with the securement element 120. The securement element 120 can wrap or extend along opposing sides of a user's head. The securement element 120 can include earpieces for wrapping around or otherwise engaging or resting on a user's ears. It will be appreciated that other configurations can be applied for securing the head-mountable device 100 to a user's head. For example, one or more bands, straps, belts, caps, hats, or other components can be used in addition to or in place of the illustrated components of the head-mountable device 100. By further example, the securement element 120 can include multiple components to engage a user's head.

The frame 110 can provide structure around a peripheral region thereof to support any internal components of the frame 110 in their assembled position. For example, the frame 110 can enclose and support various internal components (including for example integrated circuit chips, processors, memory devices and other circuitry) to provide computing and functional operations for the head-mountable device 100, as discussed further herein. Any number of components can be included within and/or on the frame 110 and/or the securement element 120.

The frame 110 can include and/or support one or more camera modules 130. The camera modules 130 can be positioned on or near an outer side 122 of the frame 110 to capture images of views external to the head-mountable device 100. The captured images can be used for display to the user or stored for any other purpose.

The head-mountable device can be provided with display modules that provide visual output for viewing by a user wearing the head-mountable device. As further shown in FIG. 1, one or more display modules 140 can be positioned on an inner side 124 of the head-mountable device 100, for example within an eye chamber 126. For example, a pair of display modules 140 can be provided, where each display module 140 is movably positioned to be within the field of view of each of a user's two eyes. Each display module 140 can be adjusted to align with a corresponding eye of the user. For example, each display module 140 can be moved along one or more axes until a center of each display module 140 is aligned with a center of the corresponding eye.

A display module 140 can transmit light from a physical environment (e.g., as captured by a camera module) for viewing by the user. Such a display module 140 can include optical properties, such as lenses for vision correction based on incoming light from the physical environment. Additionally or alternatively, a display module 140 can provide information as a display within a field of view of the user. Such information can be provided to the exclusion of a view of a physical environment or in addition to (e.g., overlaid with) a physical environment.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment.

In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Examples of mixed realities include augmented reality and augmented virtuality.

An augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment.

An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof.

An augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

There are many different types of electronic systems that enable a person to sense and/or interact with various CGR environments. Examples include head-mountable systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head-mountable system may have one or more speaker(s) and an integrated opaque display. Alternatively, a head-mountable system may be configured to accept an external opaque display (e.g., a smartphone). The head-mountable system may incorporate one or more imaging sensors to capture images or video of the physical environment, and/or one or more microphones to capture audio of the physical environment. Rather than an opaque display, a head-mountable system may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

Referring again to FIG. 1, the head-mountable device can be provided with one or more flow channels that extend through at least a portion of the frame thereof to provide cooling to components of the head-mountable device. As shown in FIG. 1, the flow channels can include and/or be connected to a system inlet 112 and/or a cooling module inlet 114. The system inlet 112 can provide airflow directly to one or more components of the head-mountable device 100, such as a circuit component 150. The cooling module inlet 114 can provide airflow directly to the cooling module 200 of the head-mountable device 100. Additionally or alternatively, the cooling module 200 can receive a flow from the system inlet 112. The air received by the system inlet 112 and/or the cooling module inlet 114 can be directed to an outlet 116 and/or other outlets for exhaust out of the head-mountable device 100.

While the system inlet 112 is depicted at a bottom portion of the frame 110, the cooling module inlet 114 is depicted at a front portion of the frame 110, and the outlet 116 is depicted at a top portion of the frame 110, it will be recognized that inlets, outlets, and flow channels there between can be positioned at any portion of the head-mountable device 100. The outlet 116 can be provided at a location that will allow exiting air to exhaust to an environment that is not disruptive to the user. For example, the outlet 116 can be provided at a location and in and orientation that directs hot air away from the user. Multiple flow channels can be interconnected, such that multiple inlets and/or multiple outlets are connected to each other.

One or more cooling modules 200 can be operated to provide cooling to one or more circuit components 150 of the head-mountable device 100. The circuit component 150 can be an electrical component that generates heat during operation. The circuit component 150 can be a component of a circuit board 152. The circuit component 150 can be operably and structurally coupled to the circuit board 152. A portion of the cooling module 200 can be thermally connected to the circuit component 150.

The cooling module 200 can be positioned at or connected to a system inlet 112, a cooling module inlet 114, an outlet 116, or a position between two or more of the foregoing. For example, the cooling module 200, the circuit component 150, and/or the circuit board 152 can be positioned within a component chamber 118 of the head-mountable device 100.

While several components are shown within the frame 110, it will be understood that some or all of these components can be located anywhere within or on the head-mountable device 100. For example, one or more of these components can be positioned within the securement element of the head-mountable device 100.

Figure 2:
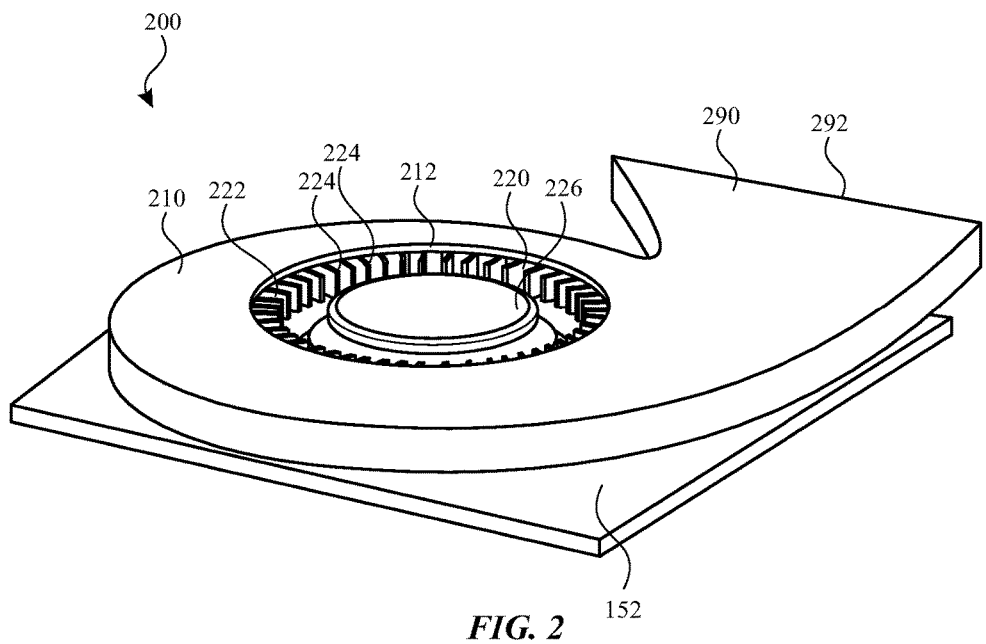
FIG. 2 illustrates a perspective view of a cooling module for a head-mountable device, according to some embodiments of the present disclosure.

Referring now to FIG. 2, the cooling module can provide features for moving air across surfaces for dissipating heat. As shown in FIG. 2, the cooling module 200 can include a cover 210 over a fan 220. The cover 210 can form an inlet 212, for example through a top surface thereof. The cover 210 can include or be connected to an exhaust duct 290 that forms and outlet 292 of the cooling module 200.

The fan 220 of the cooling module 200 can be positioned to receive air through the inlet 212 and direct the air to the outlet 292. The fan 220 can include a motor to drive rotation thereof. For example, the fan 220 can include a stator 226 and an impeller 222 configured to rotate about the stator 226. The impeller 222 can include multiple blades 224 that extend radially outwardly away from the stator 226. As the stator 226 rotates, the blades 224 receive air from the inlet 212 and direct the air radially outwardly and toward the outlet 292. The impeller 222 can be stabilized by one or more bearings between the impeller 222 and the stator 226. The bearing can include a fluid hydrodynamic bearing, for example with oil or another fluid between the impeller 222 and the stator 226. It will be understood that other types of bearings are contemplated, including mechanical bearings, journal bearings, plain bearings, ball bearings, and the like. The bearing can provide radial and/or axial support to the impeller 222 as it rotates about the stator 226.

The fan 220 can direct air or another gas within, against, or across one or more components of the cooling module 200. The fan 220 can be operated based on one or more operating parameters that are controllable during use. The operating parameters can be determined, at least in part, based on a demand for cooling (e.g., based on a temperature of one or more components). The operating parameters can be further determined based on acceptable sound levels and characteristics to be produced by the fan 220 and along the flow channel.

Figure 3:
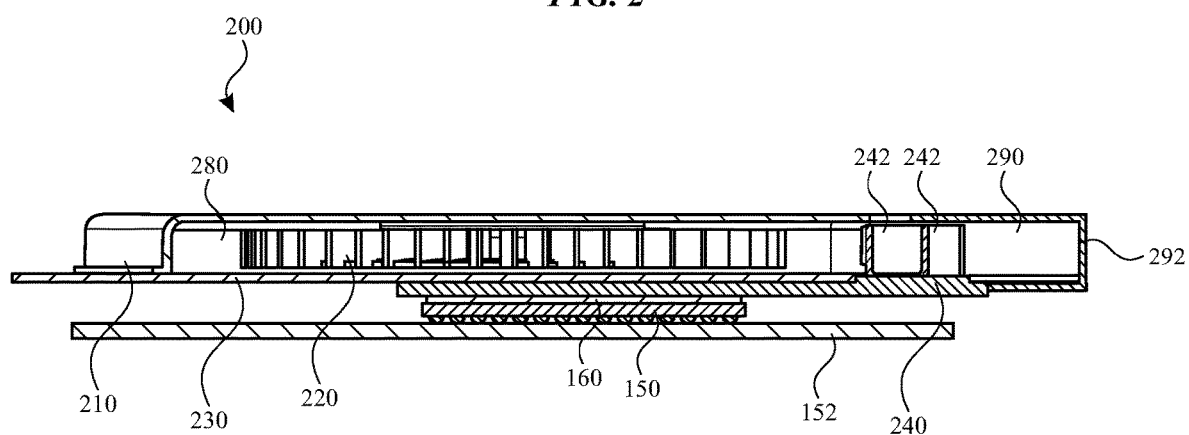
FIG. 3 illustrates a sectional view of the cooling module of FIG. 2, according to some embodiments of the present disclosure.

Referring now to FIG. 3, the cooling module can be thermally connected to components to be cooled. As shown in FIG. 3, the cover 210 and a back plate 230 can define a chamber 280 there between. The fan 220 can be positioned within the chamber 280 and mounted to the back plate 230. As such, the back plate 230 provide structural support to the fan 220 for stable operation (e.g., during rotation).

A heat sink 240 can provide one or more fins 242 between the chamber 280 and the outlet 292 formed by the exhaust duct 290. The heat sink 240 is thermally connected to the circuit component 150, which is operably and structurally coupled to the circuit board 152. The heat sink 240 can be thermally connected to the circuit component 150 by a direct connection (e.g., no intervening structure) or by a thermal interface 160. For example, a thermal paste or other thermally conduct of material can be provided to thermally and/or structurally connect the circuit component 150 to the heat sink 240.

In the embodiment of FIG. 3, the back plate 230 and the heat sink 240 are separate components. The back plate 230 and other components of the cooling module 200 are thermally connected to the circuit component 150 via the heat sink 240. That is, heat emanating from the circuit component 150 is received by the heat sink 240 and directed to the fins 242. Heat may also be conducted to the back plate 230 and other components of the cooling module 200 via the heat sink 240.

In the embodiment of FIG. 3, the back plate 230 can be connected to the heat sink 240 and the cover 210. Furthermore, the heat sink 240 can be connected to the back plate 230 and the exhaust duct 290. However, each connection of parts requires assembly that requires time and expense. Additionally, each connection introduces an interface where discontinuities across adjacent surfaces can cause turbulent or other disrupted flow as air passes across the interface. This can create, in the flow, shed vortices that produce tonal noises.

Figure 4:
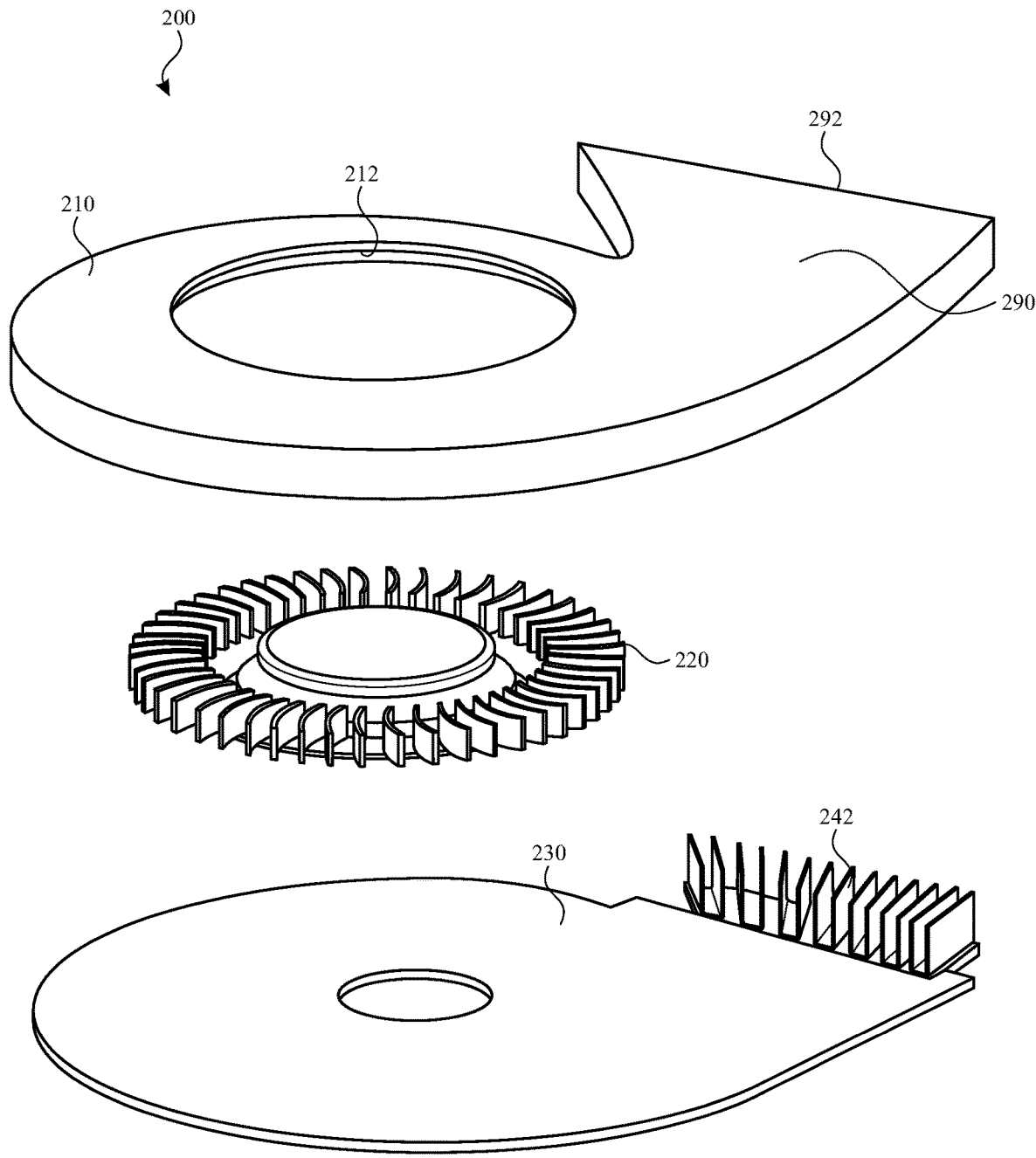
FIG. 4 illustrates an exploded perspective view of a cooling module, according to some embodiments of the present disclosure.
Figure 5:
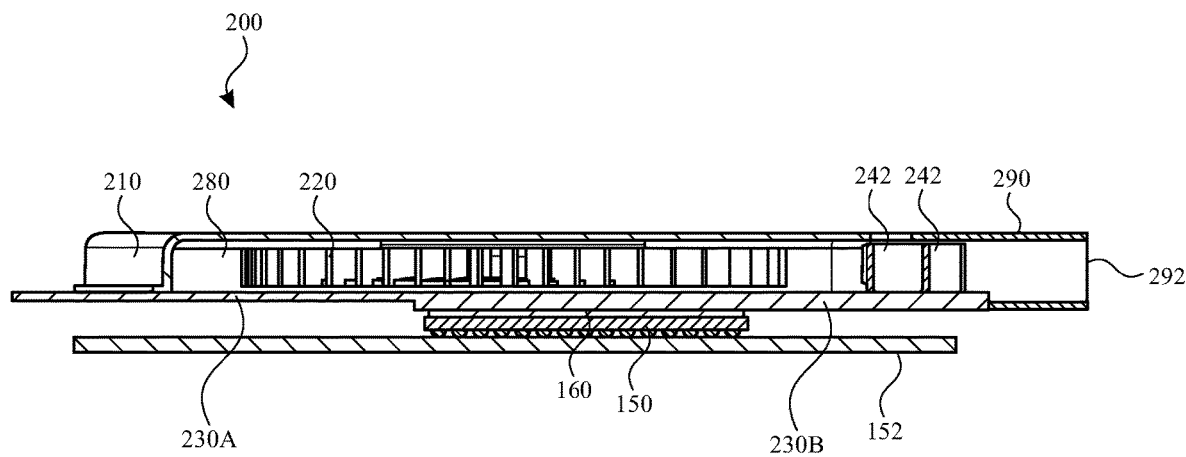
FIG. 5 illustrates a sectional view of a cooling module, according to some embodiments of the present disclosure.

Referring now to FIGS. 4 and 5, a cooling module 200 can provide enhanced heat dissipation while reducing time and expense of assembly as well as noise and vibration of a cooling module. It will be understood that the cooling module illustrated in FIGS. 4 and 5 can include various components that are similar to those illustrated in FIGS. 2 and 3 with other components that are different. It will be understood that the differences illustrated are not limiting and that other features can be included and/or omitted.

According to some embodiments, a cooling module can provide an integrated back plate and heat sink that is formed of a unitary and continuous structure. As shown in FIG. 4, the cover 210 and the back plate 230 can house the fan 220. The fan 220 can be securely mounted to the back plate 230. The back plate 230 can include and form the fins 242 that extend, for example, from a planar surface of the back plate 230.

The back plate 230, including the fins 242, can be a monolithic structure, rather than an assembly of parts. As used herein, a monolithic structure is one that is integrally formed of a single piece of material, rather than of separate pieces that are joined together by an interface. For example, the back plate 230, including the fins 242, can be a unibody and/or unitary structure. By providing a monolithic, unitary, and/or unibody back plate 230, the back plate 230 does not contain interfaces or discontinuities, such as those that occur in assembled parts. Accordingly, the monolithic, unitary, and/or unibody back plate 230 can be fabricated to more precise and consistent dimensions as well as provide greater structural support and thermal conductivity.

The back plate 230, including the fins 242, can be of a metal or other material having high thermal conductivity. The material can provide high rigidity and strength to provide support to components mounted to the back plate 230 and to securely mount to other components (e.g., the frame) of the head-mountable device.

The cover 210 can be of a material that provides protection to the fan 220 and any other components in the chamber. The material can be plastic, metal, and/or another material. The cover 210 can be a monolithic, unitary, and/or unibody structure, rather than an assembly of parts.

As shown in FIG. 5, the cooling module 200 can be thermally connected to components to be cooled. The cover 210 and the back plate 230 can define a chamber 280 there between. The fan 220 can be positioned within the chamber 280 and mounted to the back plate 230. As such, the back plate 230 provide structural support to the fan 220 for stable operation (e.g., during rotation).

The fan 220 can rotation within a plane of rotation and about an axis of rotation. The axis of rotation can extend through the inlet of the cooling module 200. The plane of rotation can extend through at least a portion of the fins 242.

The back plate 230 can form the fins 242 between the chamber 280 and the outlet 292 formed by the exhaust duct 290. The fins 242 can extend from a planar surface of the back plate 230 to (e.g., in contact with) the cover 210. The fins 242 can define flow channels between any pair of fins 242 and/or adjacent structures. The fins 242 can extend along any length between the chamber 280 (containing the fan 220) and the outlet 292 (defined by the exhaust duct 290). For example, the fins 242 can be formed near the fan 220.

An entirety of the chamber 280 can be enclosed by the cover 210 and the back plate 230. For example, the chamber 280 can have a boundary that are defined exclusively by the cover 210 and the back plate 230, while remaining open to adjacent spaces, for example via the inlet 212 and the outlet 292. Where only the cover 210 and the back plate 230 enclose the chamber 280, only a single seal can be required to join the two structures and fully define the chamber 280. For example, the cover 210 and the back plate 230 can form a single continuous seal there between. By reducing the number of separate parts, the number of seals and potential leaks are reduced. This can be particularly beneficial downstream of the fan 220, where the air is heated and a leak could allow the hot air to be directed to the circuit component 150. By providing a monolithic, unitary, and/or unibody back plate 230 with fins 242, interfaces and the needs for sealing thereat is removed.

The back plate 230 can span an entire side (e.g., bottom side) of the chamber 280, and the cover 210 can span an entire opposing side (e.g., top side) of the chamber 280. Accordingly, interfaces along the boundaries of the chamber 280 can be reduced to the seal between the cover 210 and the back plate 230. The back plate 230 can be substantially planar across a length of the chamber 280. By providing a continuous structure, the surface can be made with precision that is not interrupted by interfaces or discontinuities between separate parts.

The back plate 230 is thermally connected to the circuit component 150, which is operably and structurally coupled to the circuit board 152. The back plate 230 can be thermally connected to the circuit component 150 by a direct connection (e.g., no intervening structure) or by a thermal interface 160. For example, a thermal paste or other thermally conduct of material can be provided to thermally and/or structurally connect the circuit component 150 to the back plate 230.

The back plate 230 can include a uniform thickness or a variable thickness along its length across the chamber 280. For example, the back plate 230 can include a first portion 230A and a second portion 230B. The second portion 230B can be positioned between the first portion 230A and the fins 242. The second portion 230B, rather than the first portion 230A, can be thermally connected to the circuit component 150. For example, the first portion 230A and other components of the cooling module 200 can be thermally connected to the circuit component 150 via the second portion 230B. The second portion 230B can have features that enhance heat dissipation. For example, the second portion 230B can be thicker than the first portion 230A to more efficiently conduct heat toward the fins 242 for heat dissipation.

It will be understood that the efficient heat dissipation facilitate by the integrated back plate 230 and fins 242 may also direct a greater amount of heat into the fan 220, which is mounted to the back plate 230. Accordingly, the oil or other fluid used to suspend the impeller of the fan 220 can be selected with greater viscosity to offset the effect of the heat on reducing viscosity during operation of the circuit component 150.

The back plate 230 can be coupled to the cover 210 across various regions. The back plate 230 can be coupled to the cover 210 at one end that is opposite the outlet 292, and the base and fins 242 of the back plate 230 can be coupled to the cover 210 on another end of the cover 210, the other end being adjacent to the outlet 292. Between the two ends, the back plate 230 and the fins 242 can form a continuous (e.g., monolithic, unitary, and/or unibody) piece of material that seals to the cover 210 at each of the ends.

The cover 210 can form the exhaust duct 290 at a location beyond the fins 242. For example, the cover 210 or another structure can extend over the fins 242 to form the exhaust duct 290 on an outlet side of the fins 242 that is opposite the chamber 280. The exhaust duct 290 can be connected to the back plate 230 on the outlet side. At the connection, the parts can be sealed together. This seal can be continuous with the other portions of the seal that joins together the cover 210 and the back plate 230.

By providing an integrated back plate 230 and fins 242, the cooling module 200 provides a reduced number of parts and interfaces between parts. Accordingly, the stability of the fan 220 is enhanced by providing a monolithic, unitary, and/or unibody structure that supports the fan 220 and that extends across an entirety of the chamber 280 containing the fan 220. Additionally, the integrated back plate 230 provides a continuous structure that can then be mounted to other components of the head-mountable device, such as the frame. The more stable mounting of the fan 220 facilitated by the integrated back plate 230 and fins 242 facilitates steadier rotation of the fan 220 with less noise and vibration.

Furthermore, by providing an integrated back plate 230 and fins 242, the thickness of the parts can be reduced to provide the cooling module 200 with a small form factor. Additionally or alternatively, the cooling module 200 can be provided with larger components that still allow the cooling module to remain within a given set of dimensions. For example, the integrated back plate 230 and fins 242 can be provided with less thickness, and the blades of the fan 220 can be enlarged to occupy the available space. By further example the total weight of the cooling module 200 can be reduced to provide the user with greater comfort while wearing the head-mountable device.

The reduction of parts facilitated by providing an integrated back plate 230 and fins 242 can reduce cost and time of assembly. Additionally, leakage of air can be reduced, and the assembled product can be more easily tested for any potential leaks prior to installation into the final head-mountable device.

Figure 6:
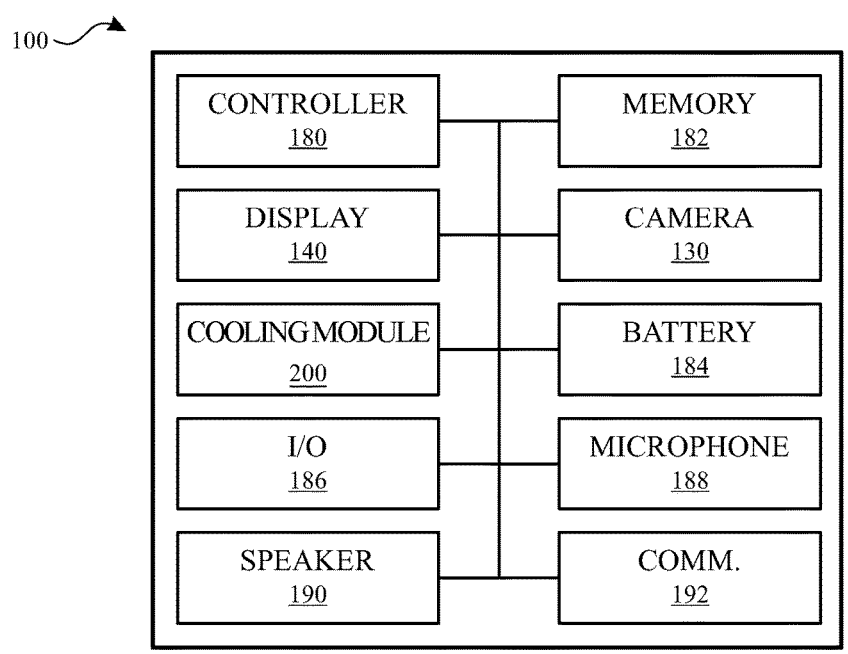
FIG. 6 illustrates a block diagram of a head-mountable device, in accordance with some embodiments of the present disclosure.

Referring now to FIG. 6, components of the head-mountable device can be operably connected to provide the performance described herein. FIG. 6 shows a simplified block diagram of an illustrative head-mountable device 100 in accordance with one embodiment of the invention. It will be appreciated that components described herein can be provided on either or both of a frame and/or a securement element of the head-mountable device 100. It will be understood that additional components, different components, or fewer components than those illustrated may be utilized within the scope of the subject disclosure.

As shown in FIG. 6, the head-mountable device 100 can include a controller 180 with one or more processing units that include or are configured to access a memory 182 having instructions stored thereon. The instructions or computer programs may be configured to perform one or more of the operations or functions described with respect to the head-mountable device 100. The controller 180 can be implemented as any electronic device capable of processing, receiving, or transmitting data or instructions. For example, the controller 180 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 182 can store electronic data that can be used by the head-mountable device 100. For example, the memory 182 can store electrical data or content such as, for example, audio and video files, documents and applications, device settings and user preferences, timing and control signals or data for the various modules, data structures or databases, and so on. The memory 182 can be configured as any type of memory. By way of example only, the memory 182 can be implemented as random access memory, readonly memory, Flash memory, removable memory, or other types of storage elements, or combinations of such devices.

The head-mountable device 100 can further include a display module 140 for displaying visual information for a user. The display module 140 can provide visual (e.g., image or video) output. The display module 140 can be or include an opaque, transparent, and/or translucent display. The display module 140 may have a transparent or translucent medium through which light representative of images is directed to a user's eyes. The display module 140 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mountable device 100 can include an optical subassembly 214 configured to help optically adjust and correctly project the image based content being displayed by the display module 140 for close up viewing. The optical subassembly 214 can include one or more lenses, mirrors, or other optical devices.

The head-mountable device 100 can include the cooling module 200 and/or any other suitable component for cooling down components of the head-mountable device 100. Suitable components can include, for example, fans, pipes for transferring heat, vents, apertures, holes, any other component suitable for distributing and diffusing heat, or any combination thereof. The cooling module 200 may also or instead be manufactured from materials selected for heat dissipation properties. For example, a housing of the head-mountable device 100 may be configured to distribute heat away from components thereof and/or the user.

The head-mountable device 100 can include a battery 184, which can charge and/or power components of the head-mountable device 100. The battery 184 can also charge and/or power components connected to the head-mountable device 100.

The head-mountable device 100 can include an input/output component 186, which can include any suitable component for connecting head-mountable device 100 to other devices. Suitable components can include, for example, audio/video jacks, data connectors, or any additional or alternative input/output components. The input/output component 186 can include buttons, keys, or another feature that can act as a keyboard for operation by the user.

The head-mountable device 100 can include the microphone 188 as described herein. The microphone 188 can be operably connected to the controller 180 for detection of sound levels and communication of detections for further processing, as described further herein.

The head-mountable device 100 can include the speakers 190 as described herein. The speakers 190 can be operably connected to the controller 180 for control of speaker output, including sound levels, as described further herein.

The head-mountable device 100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

The head-mountable device 100 can include communications circuitry 228 for communicating with one or more servers or other devices using any suitable communications protocol. For example, communications circuitry 228 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 228 can also include an antenna for transmitting and receiving electromagnetic signals.

While various embodiments and aspects of the present disclosure are illustrated with respect to a head-mountable device, it will be appreciated that the subject technology can encompass and be applied to other devices. For example, a noise mitigation system in accordance with embodiments disclosed herein can be included with an electronic device that generates heat during operation. Such an electronic device can be or include a desktop computing device, a laptop-computing device, a display, a television, a portable device, a phone, a tablet computing device, a mobile computing device, a wearable device, a watch, and/or a digital media player. Such devices can include a fan and flow channels to facilitate cooling as described herein.

Accordingly, embodiments of the present disclosure provide a head-mountable device that provides a cooling module that effectively manages heat while also minimizing noise, vibration, leakage, power consumption, size, and weight. To dissipate heat, the cooling module with a fan can be operated to move air through a chamber within the head-mountable device. An integrated heat sink can provide heat dissipation properties by drawing heat away from heat-generating components and into the chamber. The integrated heat sink can include a base plate that defines at least a portion of the chamber in which the blades of the fan are positioned. The integrated heat sink can further include fins between the chamber and an outlet. The fins can be integrated with the base plate to maximize heat dissipation and reduce the number of interfaces between separate parts.

Various examples of aspects of the disclosure are described below as clauses for convenience. These are provided as examples, and do not limit the subject technology.

Clause A: a head-mountable device comprising: a frame defining an inlet and an outlet; a circuit component; and a cooling module comprising: a cover for receiving air from the inlet; a back plate positioned opposite the cover and thermally connected to the circuit component; a fan within a chamber between the cover and the back plate, the fan being operable to direct air from the inlet to the outlet; and fins being positioned between the chamber and the outlet, extending between the back plate and the cover, and being monolithically formed with the back plate.

Clause B: a head-mountable device comprising: a circuit component; and a cooling module comprising: a cover; a back plate coupled to the cover at a first end of the cover, the back plate being thermally connected to the circuit component; a fan between the cover and the back plate; and fins being positioned extending from the back plate to the cover, the fins being coupled to the cover on a second end of the cover, opposite the first end, the back plate and the fins forming a continuous piece of material extending from the first end of the cover to the second end of the cover.

Clause C: a head-mountable device comprising: a circuit component; and a cooling module comprising: fins; a fan operable to direct air to the fins; a cover on a first side of the fan; and a monolithic back plate on a second side of the fan and comprising a first portion and a second portion, the second portion being between the first portion and the fins, being thicker than the first portion, and being thermally connected to the circuit component.

One or more of the above clauses can include one or more of the features described below. It is noted that any of the following clauses may be combined in any combination with each other, and placed into a respective independent clause, e.g., clause A, B, or C.

Clause 1: a thermal interface between the circuit component and the back plate; and a circuit board, wherein the circuit component is operably connected to the circuit board, wherein the circuit board and the thermal interface are mounted to the frame.

Clause 2: an entirety of the chamber is enclosed by the cover and the back plate, wherein the cover and the back plate form a single continuous seal there between.

Clause 3: the back plate spans an entire side of the chamber.

Clause 4: the back plate is substantially planar across a length of the chamber.

Clause 5: the back plate comprises a first portion and a second portion between the first portion and the fins, the second portion being thicker than the first portion, the second portion being thermally connected to the circuit component.

Clause 6: the fan comprises an impeller having blades and configured to rotate about an axis that extends through the inlet.

Clause 7: the fins are at least partially within a plane of rotation of the fan.

Clause 8: the cover extends over the fins to form an exhaust duct on an outlet side of the fins that is opposite the chamber, the exhaust duct being connected to the back plate on the outlet side.

Clause 9: the back plate comprises a first portion and a second portion between the first portion and the fins, the second portion being thicker than the first portion, the second portion being thermally connected to the circuit component.

Clause 10: the back plate and the fins form a unitary monolith.

Clause 11: the fan comprises an impeller having blades and configured to rotate within a plane of rotation; and the fins are at least partially within the plane of rotation of the fan.

Clause 12: the first portion, the second portion, and the fins form a unitary monolith.

As described above, one aspect of the present technology may include the gathering and use of data available from various sources. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A head-mountable device comprising:
   a frame defining an inlet and an outlet;
   a circuit component; and
   a cooling module comprising:
      a cover for receiving air from the inlet;
      a back plate positioned opposite the cover and thermally connected to the circuit component;
      a fan within a chamber between the cover and the back plate, the fan being operable to direct air from the inlet to the outlet; and
      fins being positioned between the chamber and the outlet, extending between the back plate and the cover, and being monolithically formed with the back plate,
      wherein the cover forms an exhaust duct extending from the fins to the back plate with the fins positioned between the exhaust duct and the chamber, wherein an entirety of the chamber is enclosed by the cover and the back plate, wherein the cover and the back plate form a single continuous seal there between that extends to the exhaust duct.

2. The head-mountable device of claim 1, further comprising:
   a thermal interface between the circuit component and the back plate; and
   a circuit board, wherein the circuit component is operably connected to the circuit board, wherein the circuit board and the thermal interface are mounted to the frame.

3. The head-mountable device of claim 1, wherein the back plate spans an entire side of the chamber.

4. The head-mountable device of claim 1, wherein the back plate is substantially planar across a length of the chamber.

5. The head-mountable device of claim 1, wherein the back plate comprises a first portion and a second portion between the first portion and the fins, the second portion being thicker than the first portion, the second portion being thermally connected to the circuit component.

6. The head-mountable device of claim 1, wherein the fan comprises an impeller having blades and configured to rotate about an axis that extends through the inlet.

7. The head-mountable device of claim 1, wherein the fins are at least partially within a plane of rotation of the fan.

8. The head-mountable device of claim 1, wherein the cover extends over the fins to form an exhaust duct on an outlet side of the fins that is opposite the chamber, the exhaust duct being connected to the back plate on the outlet side.

9. A head-mountable device comprising:
   a circuit component; and
   a cooling module comprising:
      a cover;
      a planar back plate coupled to the cover at a first end of the cover, the planar back plate being thermally connected to the circuit component;
      a fan between the cover and the planar back plate; and
      fins being positioned extending from the planar back plate to the cover, the fins being coupled to the cover on a second end of the cover, opposite the first end, the planar back plate and the fins forming a continuous piece of material extending from the first end of the cover to the second end of the cover, wherein the second end of the cover forms an exhaust duct extending from the fins to the planar back plate to surround an outlet.

10. The head-mountable device of claim 9, wherein the planar back plate comprises a first portion and a second portion between the first portion and the fins, the second portion being thicker than the first portion, the second portion being thermally connected to the circuit component.

11. The head-mountable device of claim 9, wherein the planar back plate and the fins form a unitary monolith.

12. The head-mountable device of claim 9, wherein an entire chamber containing the fan is enclosed by the cover and the planar back plate, wherein the cover and the planar back plate form a single continuous seal there between.

13. The head-mountable device of claim 12, wherein the second end of the cover forms the exhaust duct on an outlet side of the fins that is opposite the chamber, the exhaust duct being connected to the planar back plate on the outlet side.

14. The head-mountable device of claim 9, wherein:
   the fan comprises an impeller having blades and configured to rotate within a plane of rotation; and
   the fins are at least partially within the plane of rotation of the fan.

15. A head-mountable device comprising:
   a circuit component; and
   a cooling module comprising:
      fins;
      a fan operable to direct air to the fins;
      a cover on a first side of the fan; and
      a monolithic back plate on a second side of the fan and comprising a first portion and a second portion, the second portion being between the first portion and the fins, being thicker than the first portion, overlapping with an entirety of the circuit component, and overlapping with at least a portion of the fan.

16. The head-mountable device of claim 15, wherein the first portion, the second portion, and the fins form a unitary monolith.

17. The head-mountable device of claim 15, wherein an entire chamber containing the fan is enclosed by the cover and the back plate, wherein the cover and the back plate form a single continuous seal there between.

18. The head-mountable device of claim 17, wherein the cover extends over the fins to form an exhaust duct on an outlet side of the fins that is opposite the chamber, the exhaust duct being connected to the back plate on the outlet side.

19. The head-mountable device of claim 15, wherein:
   the fan comprises an impeller having blades and configured to rotate within a plane of rotation; and
   the fins are at least partially within the plane of rotation of the fan.

* * * * *